United States Patent
Ramappa

(10) Patent No.: US 8,183,546 B2
(45) Date of Patent: May 22, 2012

(54) ION IMPLANTATION THROUGH LASER FIELDS

(75) Inventor: Deepak A. Ramappa, Cambridge, MA (US)

(73) Assignee: VARIAN Semiconductor Equipment Associates, Inc., Gloucester, MA (US)

( * ) Notice: Subject to any disclaimer, the term of this patent is extended or adjusted under 35 U.S.C. 154(b) by 298 days.

(21) Appl. No.: 12/712,816

(22) Filed: Feb. 25, 2010

(65) Prior Publication Data

US 2011/0204264 A1    Aug. 25, 2011

(51) Int. Cl.
*G21K 5/04* (2006.01)
(52) U.S. Cl. .............. 250/492.3; 250/251; 250/492.1; 250/492.2; 250/492.22
(58) Field of Classification Search ........... 250/251, 250/492.1, 492.2, 492.21, 492.22, 492.3
See application file for complete search history.

(56) References Cited

OTHER PUBLICATIONS

A. Pukhov & J. Meyer-Ter-Venn, "Relativistic Magnetic Self-Channeling of Light in Near-Critical Plasma: Three-Dimensional Particle-in-Cell Simulation," Phys. Rev. Letters, May 20, 1996, pp. 3975-3978, vol. 76, No. 21, American Physical Society.
J. Faure et al., "A Laser-Plasma Accelerator Producing Monoenergetic Electron Beams," Nature, Sep. 30, 2004, pp. 541-544, vol. 431, Nature Publishing Group.

*Primary Examiner* — Michael Maskell
*Assistant Examiner* — Hanway Chang

(57) ABSTRACT

Ions are generated and directed toward a workpiece. A laser source generates a laser that is projected above the workpiece in a line. As the laser is generated, a fraction of the ions are blocked by the laser. This may enable selective implantation or modification of the workpiece. In one particular embodiment, the lasers are generated while ions are directed toward the workpiece and then stopped. Ions are still directed toward the workpiece after the lasers are stopped.

18 Claims, 15 Drawing Sheets

ION IMPLANTATION THROUGH LASER FIELDS

FIELD

This invention relates to plasma processing and, more particularly, to plasma processing using lasers as a mask.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

Solar cells are one example of a device that uses silicon workpieces. Any reduced cost to the manufacture or production of high-performance solar cells or any efficiency improvement to high-performance solar cells would have a positive impact on the implementation of solar cells worldwide. This will enable the wider availability of this clean energy technology.

In fabricating a solar cell, two factors must be considered. The first factor is series resistance (Rs), or the total resistance of the solar cell material. Rs limits the fill factor, or the ratio of the maximum power point divided by the product of the open circuit voltage ($V_{OC}$) and the short circuit current ($I_{SC}$). As Rs increases, the voltage drop between the junction voltage and the terminal voltage becomes greater for the same flow of current. This results in a significant decrease in the terminal voltage and a slight reduction in $I_{SC}$. Very high values of Rs also produce a significant reduction in $I_{SC}$. In such regimes, the Rs dominates and the behavior of the solar cell resembles that of a resistor. Thus, if $V_{OC}$ and/or $I_{SC}$ decrease, then the cell efficiency decreases as well. This decrease may be a linear function in one instance.

The second factor is photon conversion efficiency, which limits $I_{SC}$. If the front surface of a solar cell is doped at a high level, series resistance will be reduced but recombination loss of the charge carriers increases. This recombination occurs due to interstitial dopants that are not incorporated into the crystal lattice. These dopant sites become recombination centers. This phenomenon is called Shockley-Read-Hall recombination. A solution that reduces recombination loss is to elevate doping levels only under the front surface contacts of the solar cell. This technique is known as a selective emitter.

One method to form a selective emitter in a solar cell is to perform a high-dose implant selectively in a region where the metal contacts or other conductors will eventually be formed. This requires either an expensive photolithography step or the use of a shadow or stencil mask to perform a selective or patterned implant. If a shadow or stencil mask is used, it must be carefully aligned to the desired implant areas. This may require an accuracy of approximately 10-20 μm for current solar cell designs. Accordingly, there is a need in the art for an improved method of selectively doping or modifying workpieces.

SUMMARY

According to a first aspect of the invention, an apparatus is provided. The apparatus comprises an apparatus that generates ions and a workpiece. A laser source generates a laser that is projected above the workpiece in a line. The line is disposed above a portion of the workpiece.

According to a second aspect of the invention, a method of workpiece processing is provided. The method comprises generating a laser above a workpiece. Ions are directed toward the workpiece. A fraction of the ions are blocked with the laser and ions impact the workpiece in a first region.

According to a third aspect of the invention, a method of workpiece processing is provided. The method comprises generating a laser above a workpiece. Ions are directed toward the workpiece. A fraction of the ions directed through the laser are blocked such that the workpiece is implanted to a first dose in a first region shadowed by the laser and a second dose in a second region.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the process described herein may be performed by, for example, a beam-line ion implanter or a plasma doping ion implanter. Such a plasma doping ion implanter may use RF or other plasma generation sources. Other plasma processing equipment or equipment that generates ions also may be used. Such a tool may be used to implant or dope a workpiece, but also may be used for material modification of the workpiece such as, for example, amorphization. A solar cell is specifically disclosed as a workpiece, however, the workpiece also may be a semiconductor wafer, a flat panel, or other workpieces known to those skilled in the art. Furthermore, while a specific silicon solar cell design is disclosed, other solar cell workpiece materials or solar cell designs also may benefit from embodiments of the process described herein. In the embodiments described herein, the ion species may be, for example, P, As, B, Sb, Al, or In. Other ion species also may be used and this application is not limited merely to the ion species listed.

Figure 1:
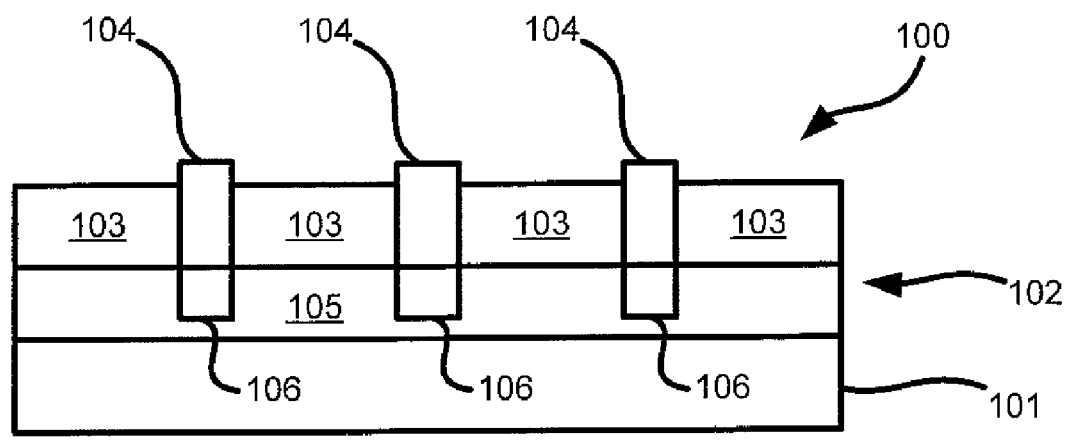
FIG. 1 is a cross-sectional view of an exemplary solar cell.

FIG. 1 is a cross-sectional view of an exemplary solar cell. Other embodiments or designs are possible and the embodiments of the process described herein are not solely limited to the solar cell 100 illustrated in FIG. 1. The solar cell 100 includes a base 101 and an emitter 102. The emitter 102 includes first doped region 105 and second doped regions 106. The base 101 and emitter 102 are oppositely doped such that one is n-type and the other is p-type. Above the emitter 102 is an anti-reflective coating 103. This anti-reflective coating 103 may be SiN. In one particular embodiment, an oxide layer is disposed between the anti-reflective coating 103 and the emitter 102. Metal lines 104 are located above the emitter 102 within the anti-reflective coating 103. While a metal line 104 is specifically disclosed, other conductors also may be used. In one instance, the second doped regions 106 are doped to a higher concentration than the first doped region 105.

Figure 2:
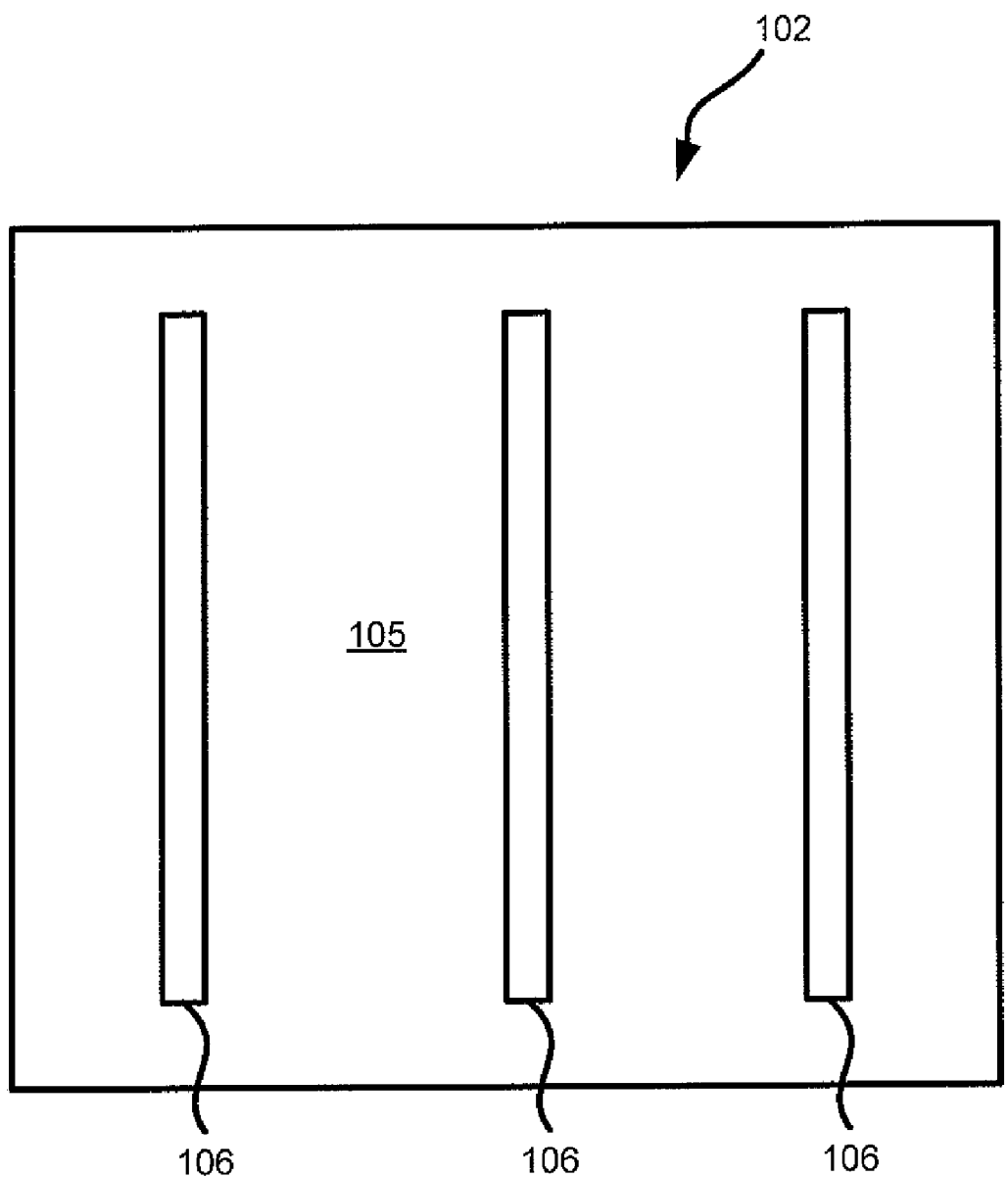
FIG. 2 is a top perspective view of an exemplary solar cell.

FIG. 2 is a top perspective view of an exemplary solar cell. The emitter 102 has a first doped region 105. The second doped regions 106 are located within the first doped region 105. An emitter 102 may have multiple second doped regions 106. Each of these second doped regions 106 may correspond with the position of a metal line 104 as illustrated in FIG. 1, although other patterns or doping locations are possible. To accomplish the doping of the second doped regions 106, dopants may be introduced into the second doped regions 106 using, for example, a beam line ion implanter, plasma immersion, or gaseous diffusion. A mask on or over the emitter 102 may enable doping of the second doped regions 106 and not the entire emitter 102.

Figure 3:
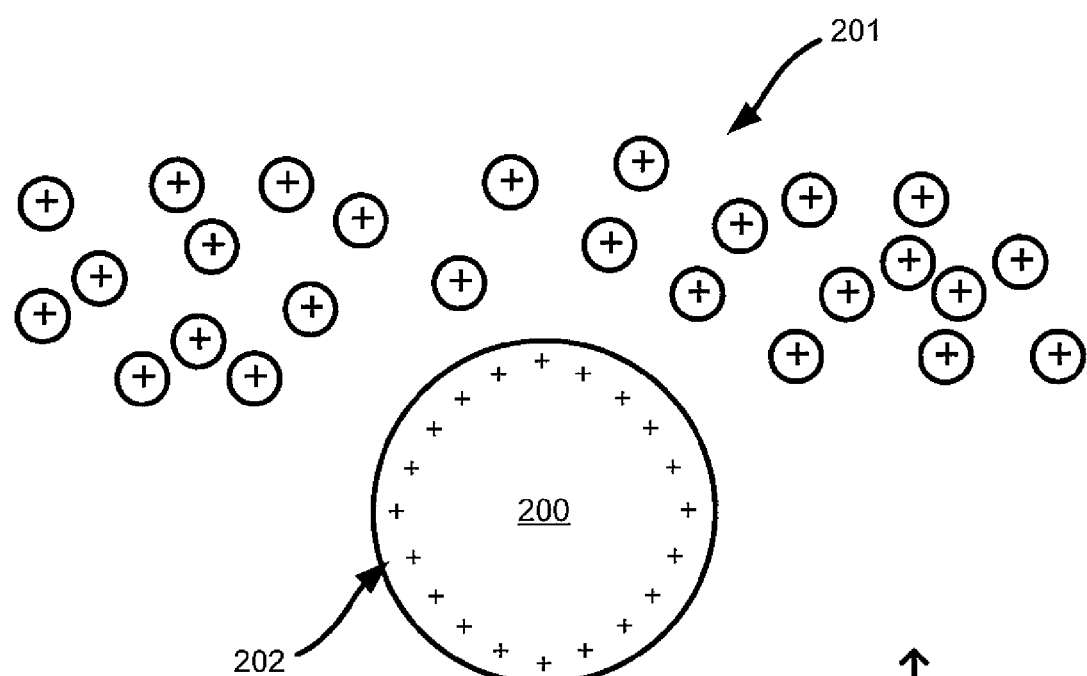
FIG. 3 is a cross-sectional view of a laser in proximity to ions.
Figure 3:
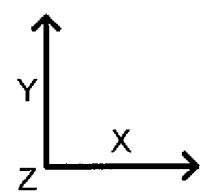

FIG. 3 is a cross-sectional view of a laser in proximity to ions. In FIG. 3, the laser 200 is going into the page in the Z direction. A laser 200 is emitted light, which consists of transverse electromagnetic waves. The light has both a magnetic field and an electric field. The laser 200 may be a high-intensity, coherent, superimposed light beam. Coherent may mean that the light is less distorted or that the light has photons with uniform wave fronts.

When a wave, such as the electromagnetic waves of the laser 200, pass through a medium, then the existing field around the wave is perturbed or disrupted. For example, a plasma has a static field that is disrupted when a laser 200 passes through. In the embodiment of FIG. 3, the laser 200 is surrounded by ions 201. In this particular embodiment, the ions 201 are positively-charged, but the ions 201 also may be negatively-charged.

If the power of the laser 200 is increased, then the energy, voltage, or current of the laser 200 is increased. Thus, the electric field of the laser 200 increases because output power is proportional to the voltage and current used to generate the laser 200. Thus, the power density of the laser 200 controls the field. The laser 200 may exhibit a charge as illustrated by the positive laser field 202 around the perimeter of the laser 200. As an analogy, a current or voltage wave moving in a direction generates a coaxial field around it. Here, the laser 200 is this current or voltage wave. If the laser 200 passes through a medium, the laser 200 may ionize atoms or molecules it the path of the laser 200 because energy is transferred to the outer electrons. These ionized atoms and ionized molecules interact with the laser field 202 and are either repelled, attracted, or otherwise affected. The ions 201 also may be repelled, attracted, or otherwise affected by the laser field 202 in such a manner. In one particular embodiment, the energy of the laser 200 and the wavelength of the laser 200 may be modified to create a laser field 202 within the laser 200. The laser 200 may be configured to have a highly-charged laser field 202 that is impregnable or partly-impregnable to the ions 201. In a workpiece processing system, the laser 200 may prevent ions 201 from penetrating through the laser 200, which it turn may affect regions of a workpiece that are processed.

Figure 4:
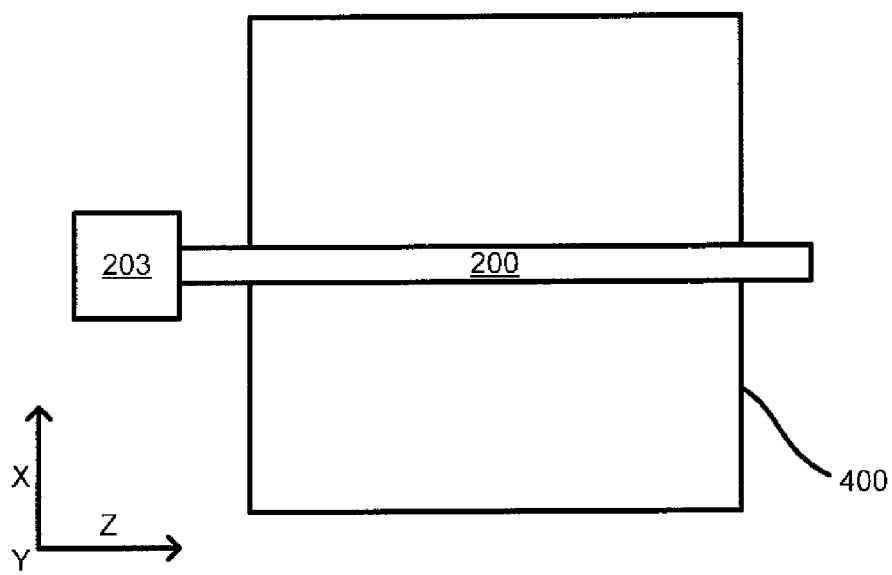
FIG. 4 is a top perspective view of a laser projected above a workpiece.
Figure 5:
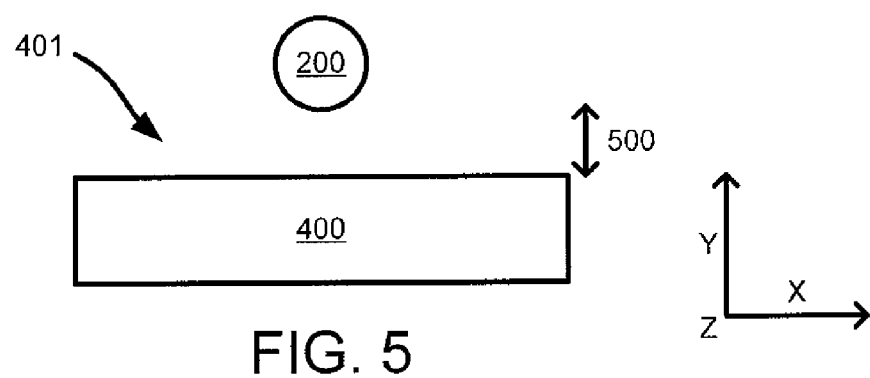
FIG. 5 is cross-sectional side view of a laser projected above a workpiece corresponding to FIG. 4.

FIG. 4 is a top perspective view of a laser projected above a workpiece and FIG. 5 is cross-sectional side view of a laser projected above a workpiece corresponding to FIG. 4. In FIGS. 4-5, corresponding axes are illustrated. The laser 200 is generated using a laser source 203. In one particular embodiment, this laser source 203 may include mirrors and a medium that is pumped to excite atoms. The laser 200 in one instance may be between approximately 0.01 kW and 1 GW. The laser 200 may be any type of laser configured to provide the required energy and wavelength combination, such as, for example, an excimer, ruby, YAG, $CO_2$, diode, or fiber laser. The laser 200 is disposed a distance 500 above a surface 401 of the workpiece 400. The distance 500 may be defined by the desired implant pattern.

Figure 6:
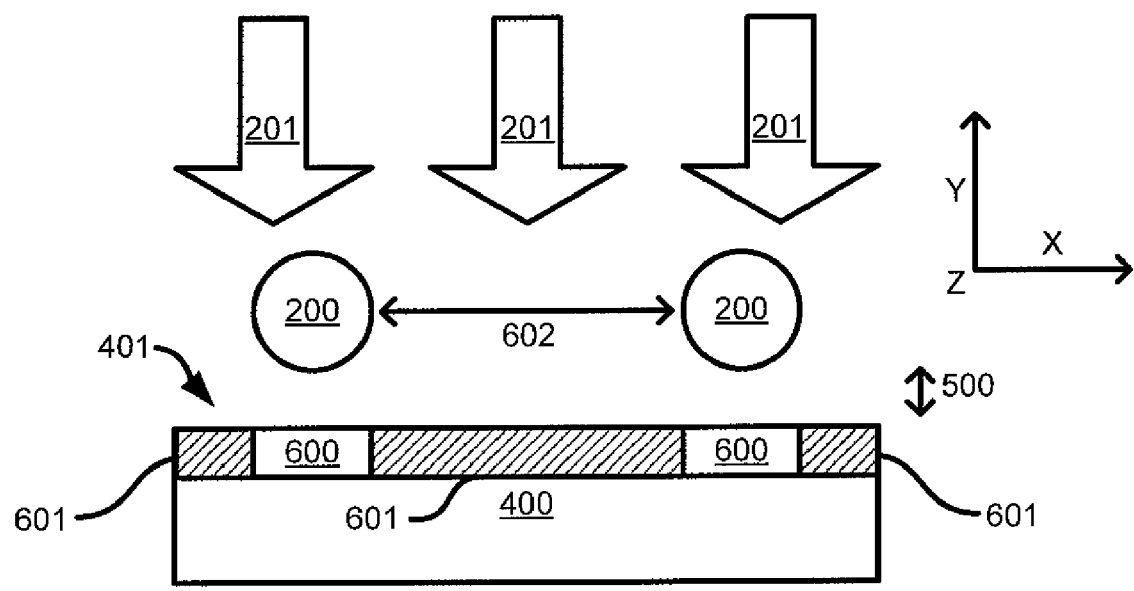
FIG. 6 is a cross-sectional side view of lasers during workpiece processing.

FIG. 6 is a cross-sectional side view of lasers during workpiece processing. In this particular embodiment, two lasers 200 are illustrated, though other numbers are possible. The lasers 200 are directed in the Z direction. The surface 401 of the workpiece 400 is disposed a distance 500 from the lasers 200. Ions 201 are directed toward the surface 401 of the workpiece 400. By selecting a laser 200 with the appropriate laser field (as illustrated in FIG. 3, for example), the ions 201 will be prevented from penetrating through the lasers 200 and the ions 201 are prevented from interacting with or impacting the workpiece 400 due to the presence of the lasers 200. In another instance, the number of ions 201 passing through the lasers 200 is reduced. Thus, the lasers 200 can be used to selectively block or mask a portion of the workpiece 400.

The ions 201 in this particular embodiment dope the workpiece 400. The ions 201 are directed toward the workpiece 400 and implant the workpiece 400. Due to the presence of the lasers 200, the ions 201 form first dose regions 600 in the portion of the workpiece 400 shadowed or masked by the lasers 200. The ions 201 form second dose regions 601 in the portion of the workpiece 400 not shadowed or masked by the lasers 200. The second dose regions 601 have a higher dose than the first dose regions 600. While the second dose regions 601 see 100% of the dose of the ions 201, the first dose regions 600 only see between approximately 0% and 30% of the dose of the ions 201. The lasers 200 block or repel the difference in dose between the first dose regions 600 and the second dose regions 601. The number of lasers 200 used depends on the number of or placement of the first dose regions 600 or on the desired implant or doping pattern.

The lasers 200 may be precisely directed above the workpiece 400. Consequently, this allows precise placement of the first dose regions 600 and the second dose regions 601. In one instance, the distance 602 between the lasers 200 and the width of the second dose region 601 may be less than approximately 5 µm.

The ions 201 in FIG. 6 in one particular embodiment are part of a plasma sheath. This plasma sheath is a region that has fewer electrons than another region of a plasma. Hence, the differences between the negative and positive charges cause a sheath potential in the plasma sheath. The light emission from this plasma sheath is less intense than elsewhere in the plasma because fewer electrons are present and fewer excitationrelaxation collisions occur. Thus, the plasma sheath is sometimes referred to as "dark space."

In one instance, the ions 201 are directed at the workpiece 400 by biasing the workpiece 400, such as with an RF field. When the RF field is applied to the workpiece 400, the ions 201 are pulled in the direction of the field. The lasers 200 may repel ions 201 that are pulled in the direction of the field through the lasers 200. However, if a higher RF field is applied to the workpiece 400, then some ions 201 may penetrate the lasers 200.

In another instance, the ions 201 are directed at the workpiece 400 with certain energy. The workpiece 400 is unbiased. The lasers 200 may repel ions 201 that are directed through the lasers 200. However, if the ions 201 have a higher energy, then some ions 201 may penetrate the lasers 200.

Figure 7:
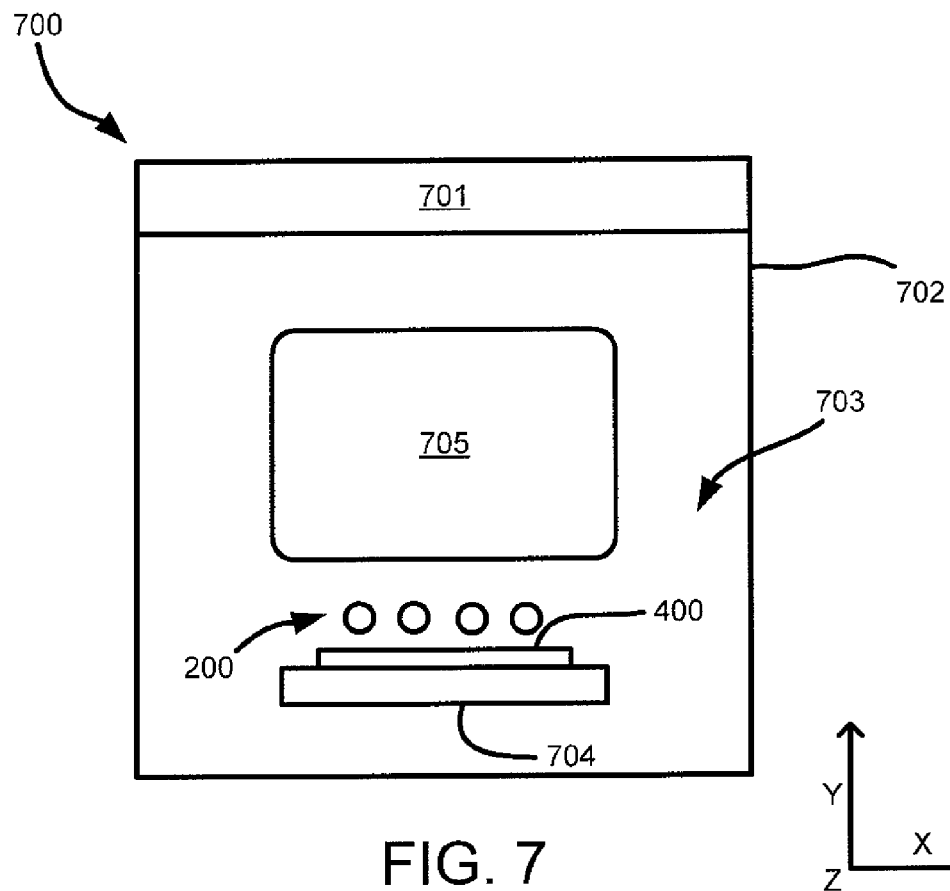
FIG. 7 is a block diagram of a plasma doping system with a laser mask.

FIG. 7 is a block diagram of a plasma doping system with a laser mask. Those skilled in the art will recognize that the plasma doping system 700 is only one of many examples of plasma doping systems that can provide ions. The plasma doping system 700 includes a process chamber 702 defining an enclosed volume 703. A platen 704 may be positioned in the process chamber 702 to support a workpiece 400. The platen 704 may be biased using a DC or RF power supply. The platen 704, workpiece 400, or process chamber 702 may be cooled or heated by a temperature regulation system. The workpiece 400 may be clamped to a flat surface of the platen 704 by electrostatic or mechanical forces. In one embodiment, the platen 704 may include conductive pins for making connection to the workpiece 400. The plasma doping system 700 further includes a source 701 configured to generate a plasma 705 within the process chamber 702. The source 701 may be an RF source or other sources known to those skilled in the art. The plasma doping system 700 may further include a shield ring, a Faraday sensor, or other components. In some embodiments, the plasma doping system 700 is part of a cluster tool or has operatively-linked process chambers 702 within a single plasma doping system 700. Thus, numerous process chambers 702 may be linked in vacuum. The plasma doping system 700 may incorporate hot or cold implantation of ions in some embodiments.

In operation, the source 701 is configured to generate the plasma 705 within the process chamber 702. In one embodiment, the source 701 is an RF source that resonates RF currents in at least one RF antenna to produce an oscillating magnetic field. The oscillating magnetic field induces RF currents into the process chamber 702. The RF currents in the process chamber 702 excite and ionize a gas to generate the plasma 705. The bias provided to the platen 704, and, hence, the workpiece 400, will accelerate ions from the plasma 705 toward the workpiece 400 during bias pulse on periods. The frequency of the pulsed platen signal and/or the duty cycle of the pulses may be selected to provide a desired dose rate. The amplitude of the pulsed platen signal may be selected to provide a desired energy. With all other parameters being equal, a greater energy will result in a greater implanted depth. The plasma doping system 700 also includes lasers 200. In this particular embodiment, four lasers 200 are illustrated directed in the Z direction.

Figure 8:
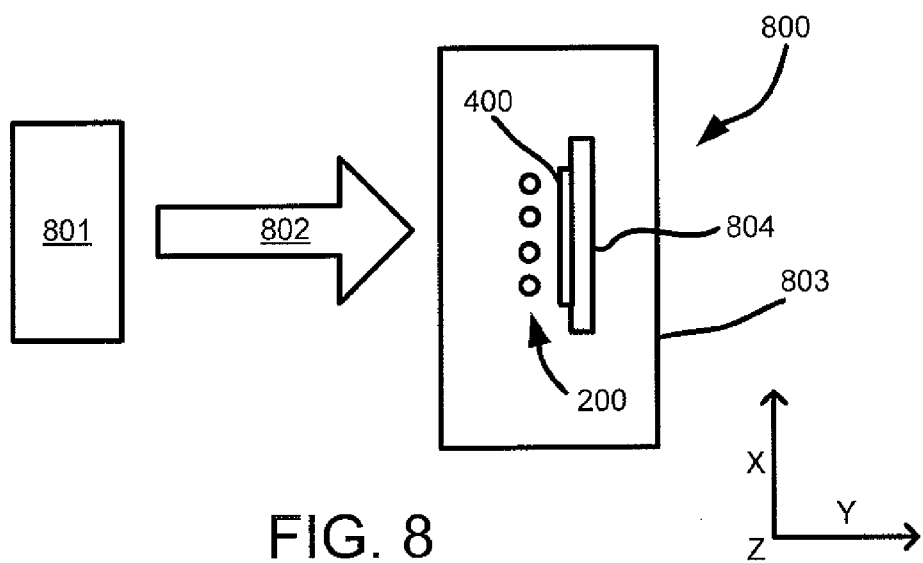
FIG. 8 is a block diagram of a beamline ion implanter with a laser mask.

FIG. 8 is a block diagram of a beamline ion implanter with a laser mask. Those skilled in the art will recognize that the beamline ion implanter 800 is only one of many examples of beamline ion implanters that can provide ions. In general, the beamline ion implanter 800 includes an ion source 801 to generate ions that are extracted to form an ion beam 802, which may be, for example, a ribbon beam or a spot beam. The ion beam 802 may be mass analyzed and converted from a diverging ion beam to a ribbon ion beam with substantially parallel ion trajectories in one instance. The beamline ion implanter 800 may further include an acceleration or deceleration unit in some embodiments.

An end station 803 supports one or more workpieces, such as workpiece 400, in the path of the ion beam 802 such that ions of the desired species are implanted into workpiece 400. The end station 803 may include a platen 804 to support the workpiece 400. The end station 803 also may include in one embodiment a scanner for moving the workpiece 400 perpendicular to the long dimension of the ion beam 802 cross-section, thereby distributing ions over the entire surface of workpiece 400. The ion implanter 800 may include additional components known to those skilled in the art such as automated workpiece handling equipment, Faraday sensors, or an electron flood gun. It will be understood to those skilled in the art that the entire path traversed by the ion beam 802 is evacuated during ion implantation. The beamline ion implanter 800 may incorporate hot or cold implantation of ions in some embodiments. The beamline ion implanter further includes lasers 200. In this particular embodiment, four lasers 200 are illustrated directed in the Z direction.

Figure 9:
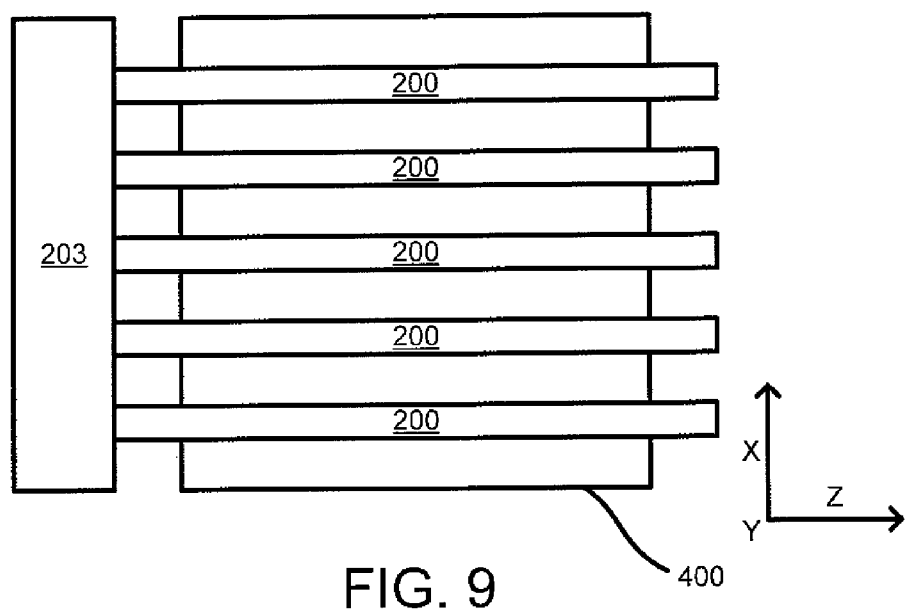
FIG. 9 is a top perspective view of lasers projected above a workpiece in a second embodiment.

FIG. 9 is a top perspective view of lasers projected above a workpiece in a second embodiment. In the embodiment of FIG. 9, the laser source 203 projects multiple lasers 200 above a workpiece 400. This may allow selective masking of the workpiece 400 during processing. Of course, multiple laser sources 203 that each project one laser 200 may be used.

Figure 10:
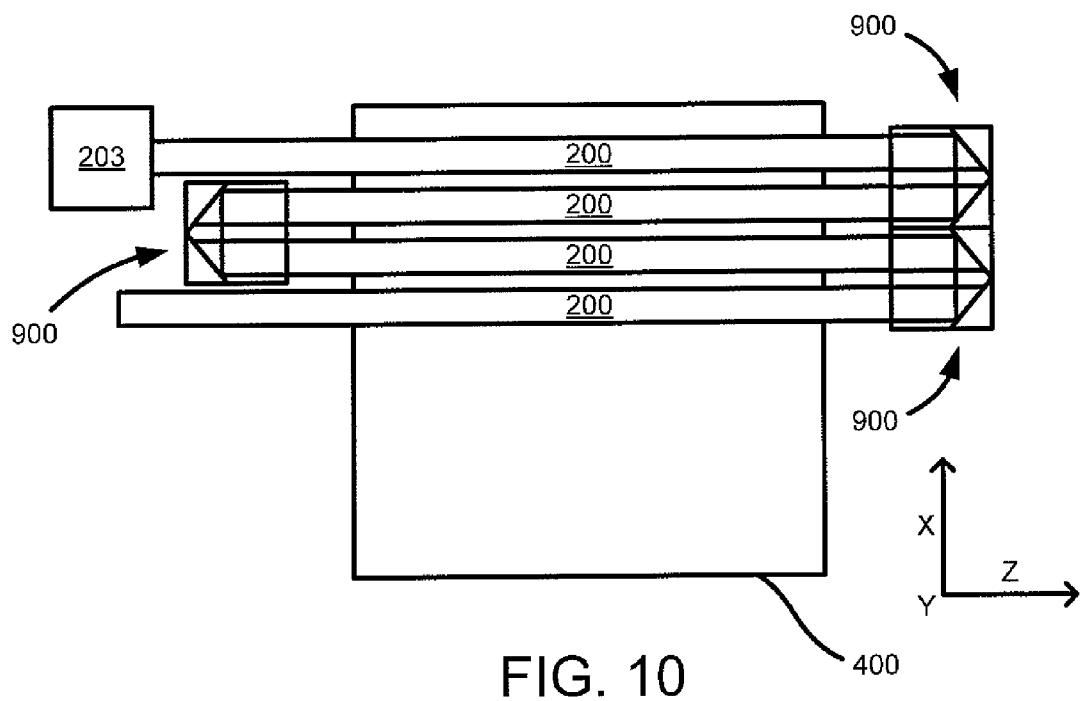
FIG. 10 is a top perspective view of a laser reflected above a workpiece.

FIG. 10 is a top perspective view of a laser reflected above a workpiece. The laser source 203 projects a laser 200 that is reflected above the workpiece 400. Reflectors 900 are used to bend the laser 200. The reflectors 900 may use mirrors or lenses. While three reflectors 900 are illustrated in FIG. 10, other numbers or placement of reflectors are possible. This enables a single laser 200 to be projected above the workpiece 400 numerous times with only one laser source 203.

FIG. 11A-D are cross-sectional views of a first embodiment of doping a workpiece. In FIG. 11A, a workpiece 400 is provided. In FIG. 11B, ions 201 are directed at the surface 401 of the workpiece 400. The lasers 200, which are projected in the Z direction, prevent the ions 201 from impacting the workpiece 400 in the areas 1100 shadowed or masked by the lasers 200. The second dose regions 601 are formed by the ions 201. In another instance, a dose less than 10% of the dose of the second dose regions 601 is implanted in the areas 1100.

Figure 11:
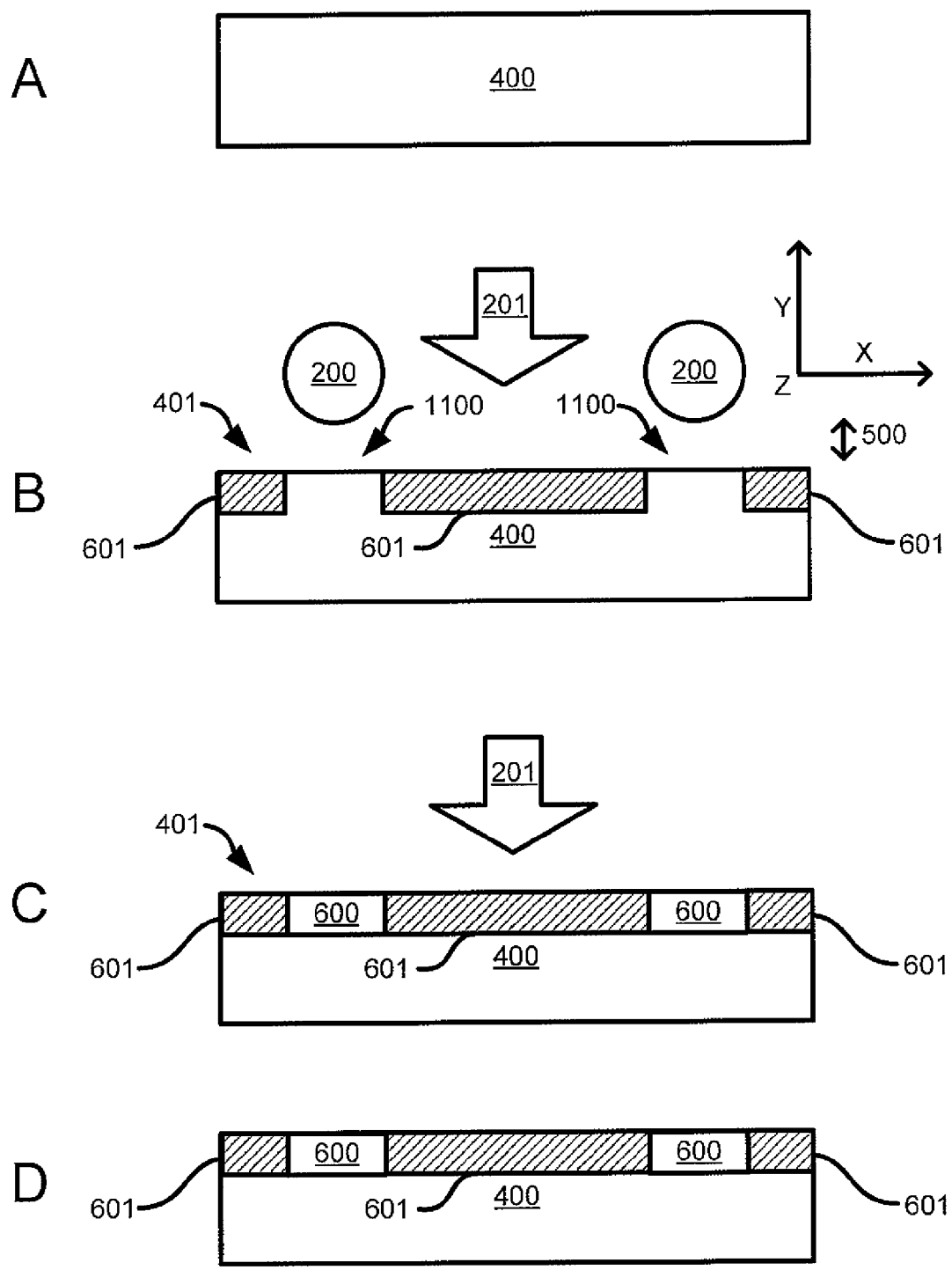
FIGS. 11A-D are cross-sectional views of a first embodiment of doping a workpiece.

In FIG. 11C, the lasers 200 are removed. The ions 201 are directed at the surface 401 of the workpiece 400. This increases the dose in the second dose regions 601 and forms the first dose regions 600. In FIG. 11D, the implantation of the workpiece 400 is complete with the first dose regions 600 and second dose regions 601 formed. The second dose regions 601 in FIG. 11 may correspond in one embodiment to the second doped regions 106 in FIG. 1. The first dose regions 600 in FIG. 11 may correspond to the first doped region 105 in FIG. 1.

FIGS. 12A-D are cross-sectional views of a second embodiment of doping a workpiece. In FIG. 12A, a workpiece 400 is provided. In FIG. 12B, ions 201 are directed at the surface 401 of the workpiece 400. The lasers 200, which are projected in the Z direction, reduce the number of ions 201 that impact the workpiece 400 in the first dose regions 600 that are shadowed or masked by the lasers 200. The second dose regions 601 are formed by the ions 201. In one instance, the first dose regions 600 have between approximately 1% and 30% of the dose in the second dose regions 601. In another instance, the first dose regions 600 have between approximately 1% and 10% of the dose in the second dose regions 601. This enables two doses to be implanted in a single implant step.

Figure 12:
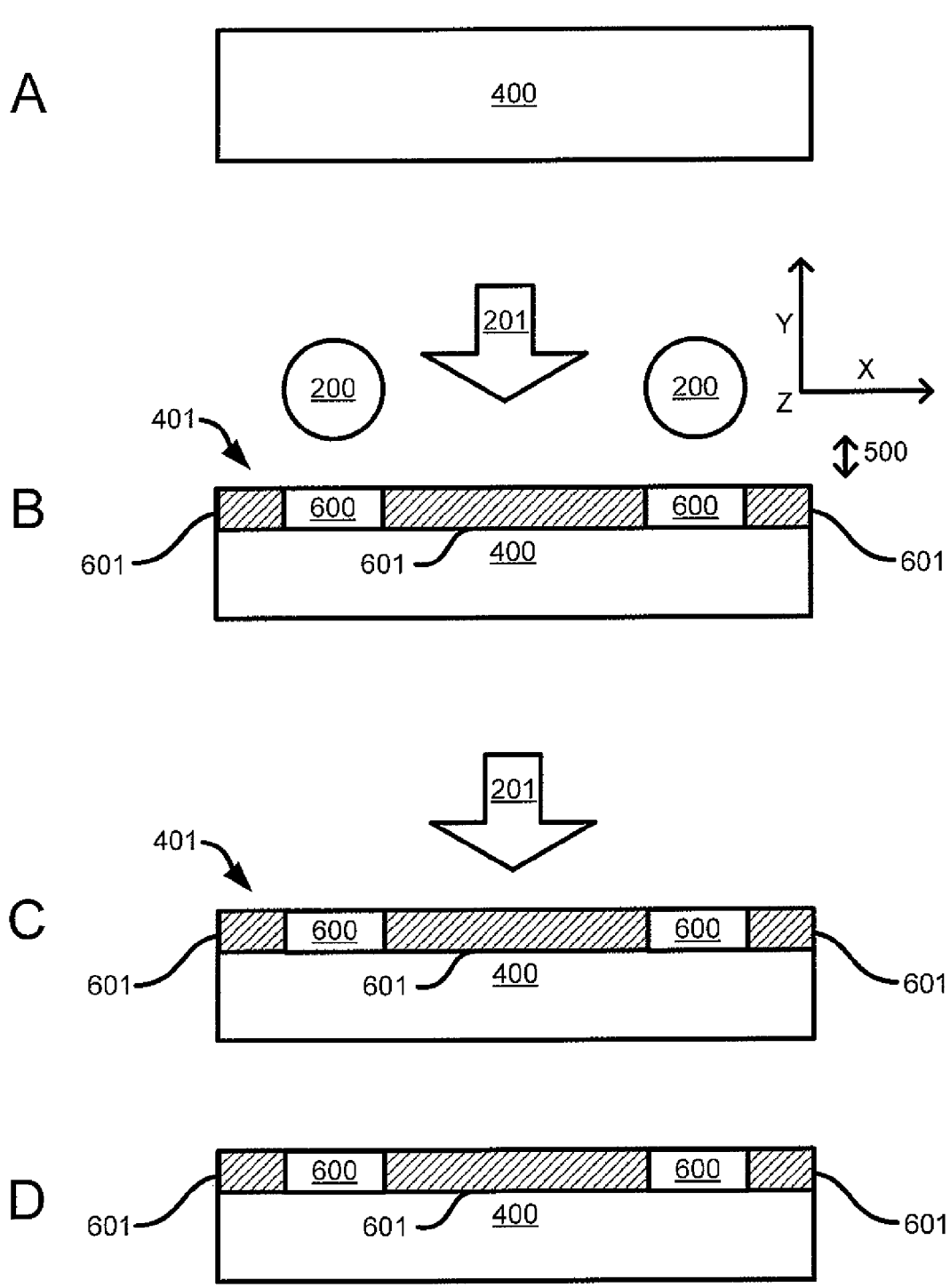
FIGS. 12A-D are cross-sectional views of a second embodiment of doping a workpiece.

In FIG. 12C, the lasers 200 are removed. The ions 201 are directed at the surface 401 of the workpiece 400. This increases the dose in the second dose regions 601 and the first dose regions 600. In FIG. 12D, the implantation of the workpiece 400 is complete with the first dose regions 600 and second dose regions 601 formed. The second dose regions 601 in FIG. 12D may correspond in one embodiment to the second doped regions 106 in FIG. 1. The first dose regions 600 in FIG. 12 may correspond to the first doped region 105 in FIG. 1.

In the embodiments of FIGS. 11A-D and FIGS. 12A-D, the steps may be performed in an alternate order. The implantation in FIGS. 11C and 12C may occur before the implantation in FIGS. 11B and 12B. Thus, the implant without lasers 200 may occur prior to the implant with the lasers 200.

Figure 13:
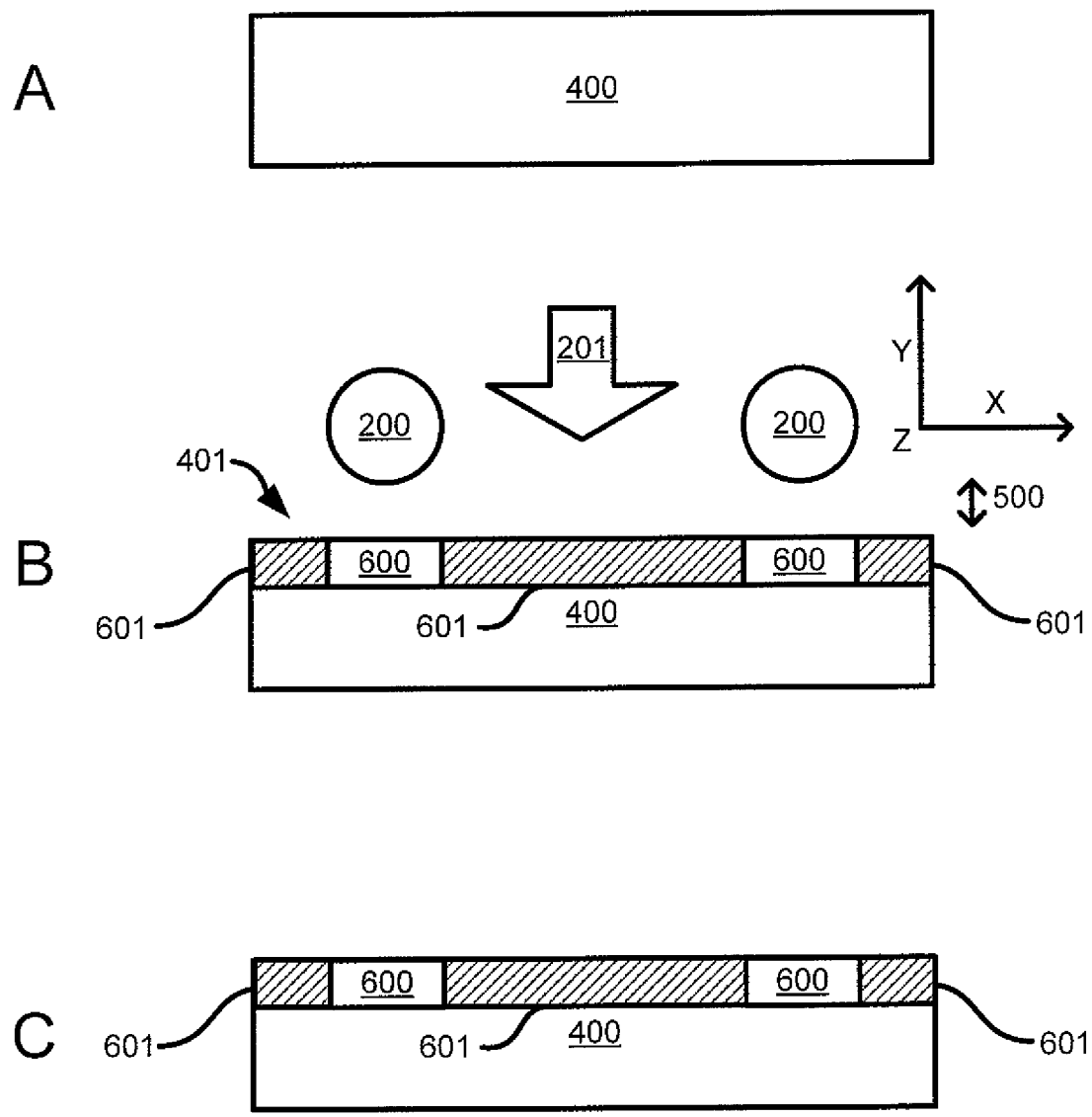
FIGS. 13A-C are cross-sectional views of a third embodiment of doping a workpiece.

In an alternate embodiment, the doping step of FIG. 12B is sufficient to dope the workpiece 400. No further implant steps, such as that illustrated in FIG. 12C, are required. This increases throughput and reduces manufacturing costs by eliminating process steps and is illustrated in the third embodiment of FIGS. 13A-C. In FIG. 13A, a workpiece 400 is provided. In FIG. 13B, ions 201 are directed at the surface 401 of the workpiece 400. The lasers 200, which are projected in the Z direction, reduce the number of ions 201 that impact the workpiece 400 in the first dose regions 600 that are shadowed or masked by the lasers 200. The second dose regions 601 are formed by the ions 201. In one instance, the first dose regions 600 have between approximately 1% and 30% of the dose in the second dose regions 601. In another instance, the first dose regions 600 have between approximately 1% and 10% of the dose in the second dose regions 601. This enables two doses to be implanted in a single implant step. In FIG. 13C, the implantation of the workpiece 400 is complete with the first dose regions 600 and second dose regions 601 formed. The second dose regions 601 in FIG. 13C may correspond in one embodiment to the second doped regions 106 in FIG. 1. The first dose regions 600 in FIG. 13C may correspond to the first doped region 105 in FIG. 1.

FIGS. 14A-D are cross-sectional views of a fourth embodiment of doping a workpiece. In FIG. 14A, a workpiece 400 is provided. In FIG. 14B, ions 201 are directed at the surface 401 of the workpiece 400. The lasers 200, which are projected in the Z direction, prevent the ions 201 from impacting the workpiece 400 in the areas 1100 shadowed or masked by the lasers 200. The first doped regions 206 are formed by the ions 201. In another instance, a dose less than 10% of the dose of the first doped regions 206 is implanted in the areas 1100. In one particular embodiment, the ions 201 are n-type.

In FIG. 14C, ions 205 are directed at the surface 401 of the workpiece 400. In one particular embodiment, the ions 205 are p-type or the opposite type of the ions 201. The lasers 204, which are projected in the Z direction, prevent or reduce the ions 205 from impacting the workpiece 400 in the first doped regions 206. The lasers 204 are configured to mask or shadow the first doped regions 206. Thus, the ions 205 form the second doped regions 207. In another instance, a dose less than 10% of the dose of the second doped regions 207 is implanted in the first doped regions 206.

Figure 14:
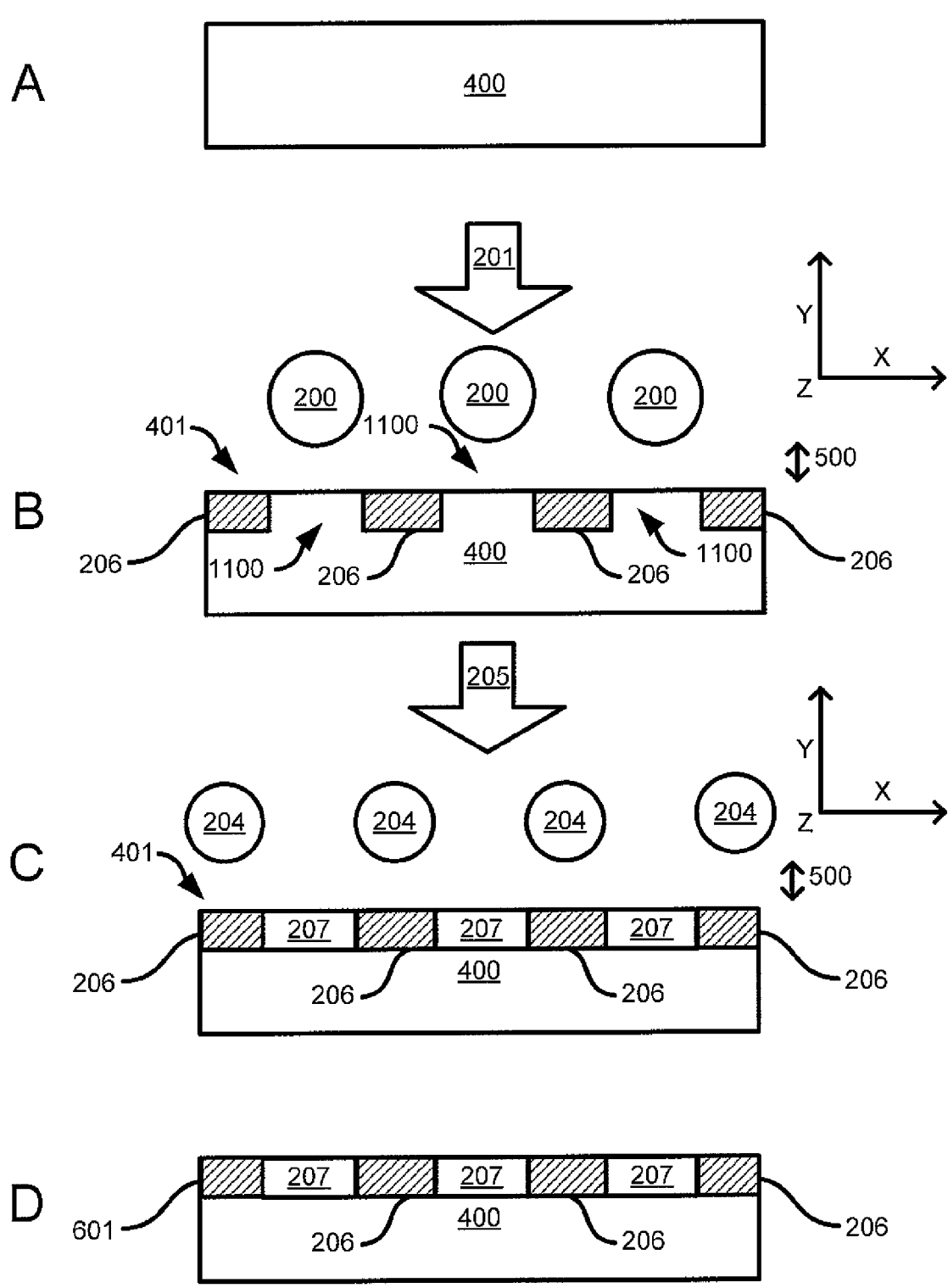
FIGS. 14-A-D are cross-sectional views of a fourth embodiment of doping a workpiece.

In FIG. 14D, the implantation of the workpiece 400 is complete with the first doped regions 206 and second doped regions 207 formed. The first doped regions 206 and second doped regions 207 are adjacent in this particular embodiment. This may be part of a interdigitated back contact (IBC) solar cell, though one skilled in the art will recognize that the embodiments of FIGS. 6 and 11-14 may be applied to many different solar cell architectures for many different purposes. Thus, the embodiments disclosed herein are not limited solely to doping a selective emitter or IBC solar cell.

Figure 15:
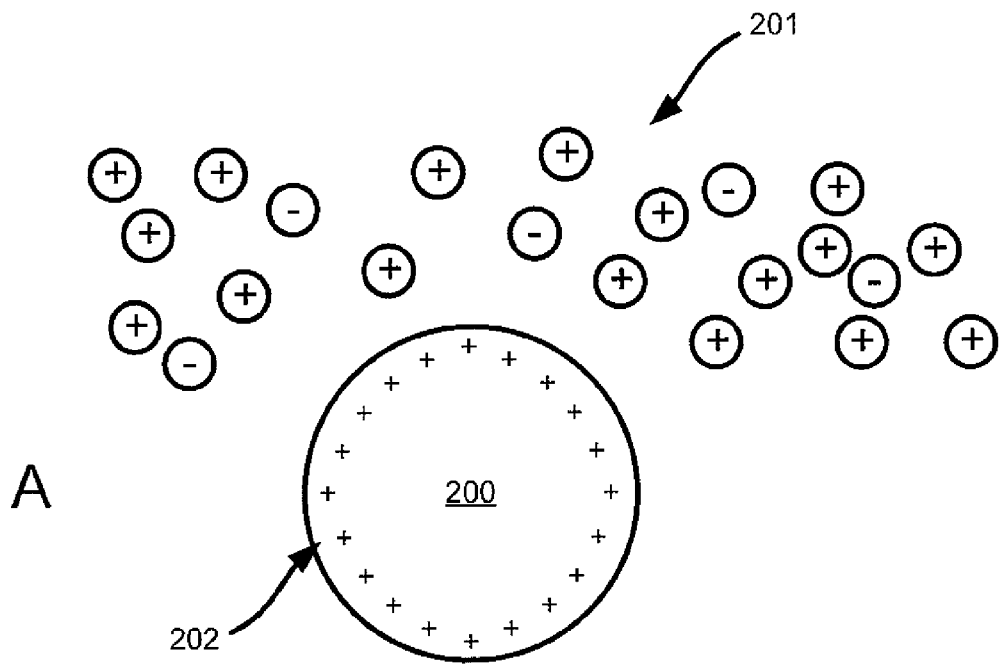
FIG. 15A-B are cross-sectional views of an embodiment of pulsing the laser.
Figure 15:
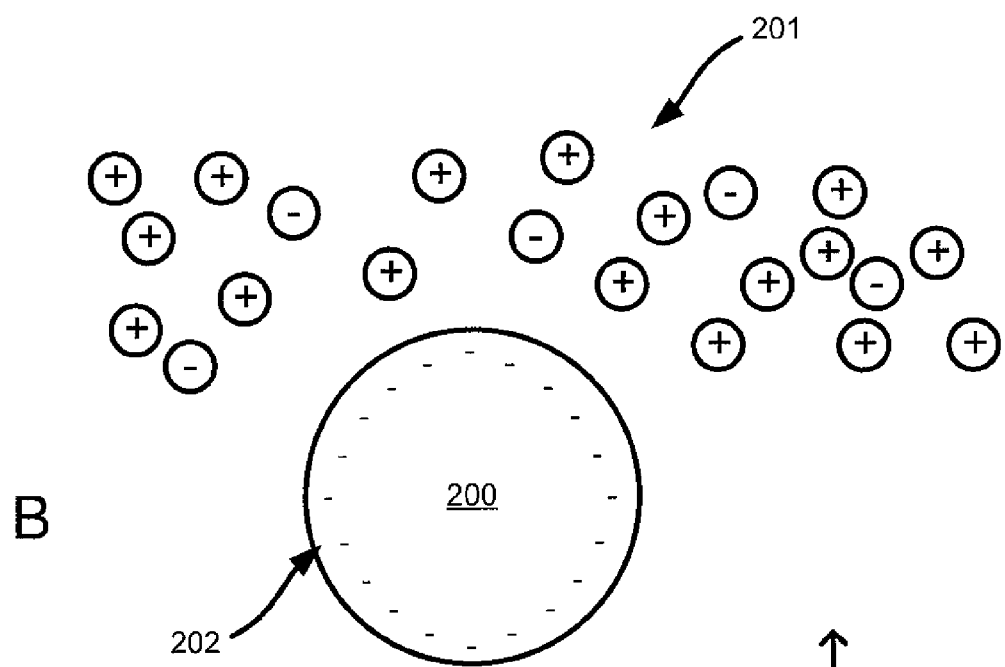

FIGS. 15A-B are cross-sectional views of an embodiment of pulsing the laser. In some instances, the ions 201 may be both positively and negatively charged. Pulsing the laser 200 will affect different ions 201. In the embodiment of FIG. 15A, the laser 200 is projected in the Z direction. The laser field 202 is positively charged. Thus, the laser 200 will primarily affect ions 201 that are positively charged. In the embodiment of FIG. 15B, the laser field 202 is negatively charged. The laser 200 in this instance will primarily affect ions 201 that are negatively charged. To pulse the laser 200, the direction of the laser field 202 is reversed. In another instance, this pulsing of the laser 200 may be a function of charge conservation. If the laser 200 is generated then the medium that the laser 200 penetrates through is at least partially ionized. Then if the laser 200 is no longer generated then the resident charge compensates itself with the opposite charge within this medium.

Figure 16:
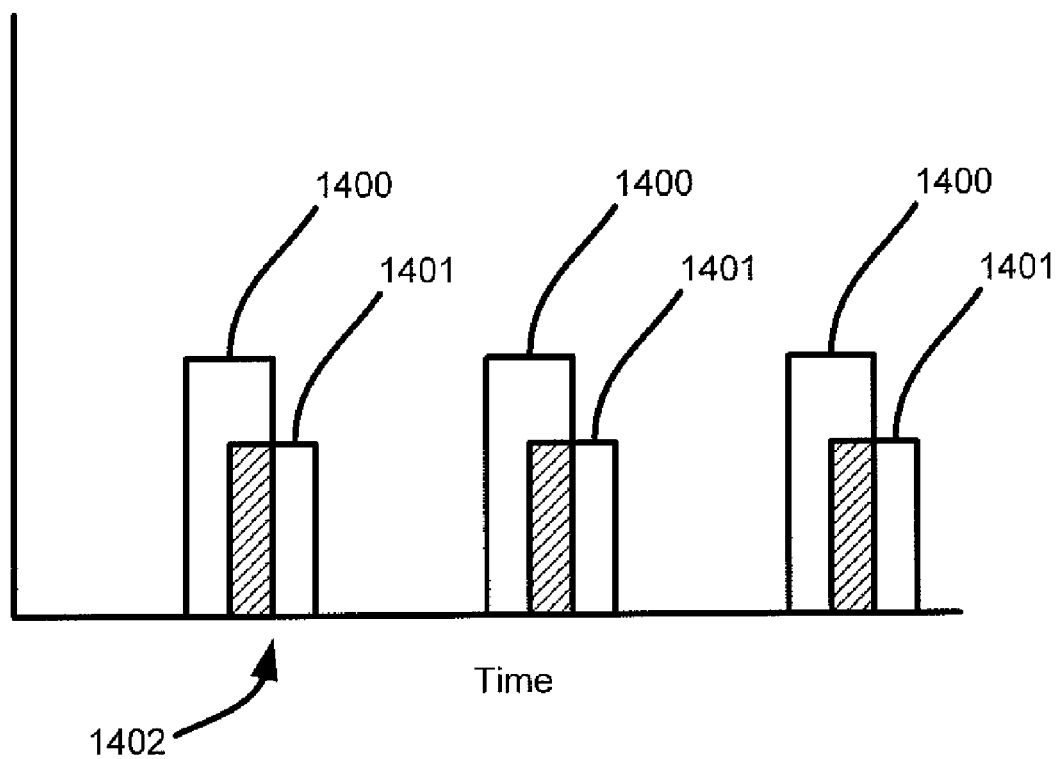
FIG. 16 is a graph illustrating wake creation with a laser.

FIG. 16 is a graph illustrating wake creation with a laser. A laser, such as the laser 200 in FIG. 6, is pulsed or generated during period 1400. Ions, such as ions 201, are generated during period 1401. As illustrated in FIG. 14 by the shaded regions, period 1400 and period 1401 are at least partially simultaneous. When period 1400 and period 1401 overlap, any ions are separated or repelled by the laser. However, after point 1402, the ions 201 are generated without the presence of a laser. There will be a void or region without ions in the area where the laser previously was directed. When the laser is not generated, such as during part of period 1401, a blanket implant of a workpiece, such as the workpiece 400, may be performed.

Figure 17:
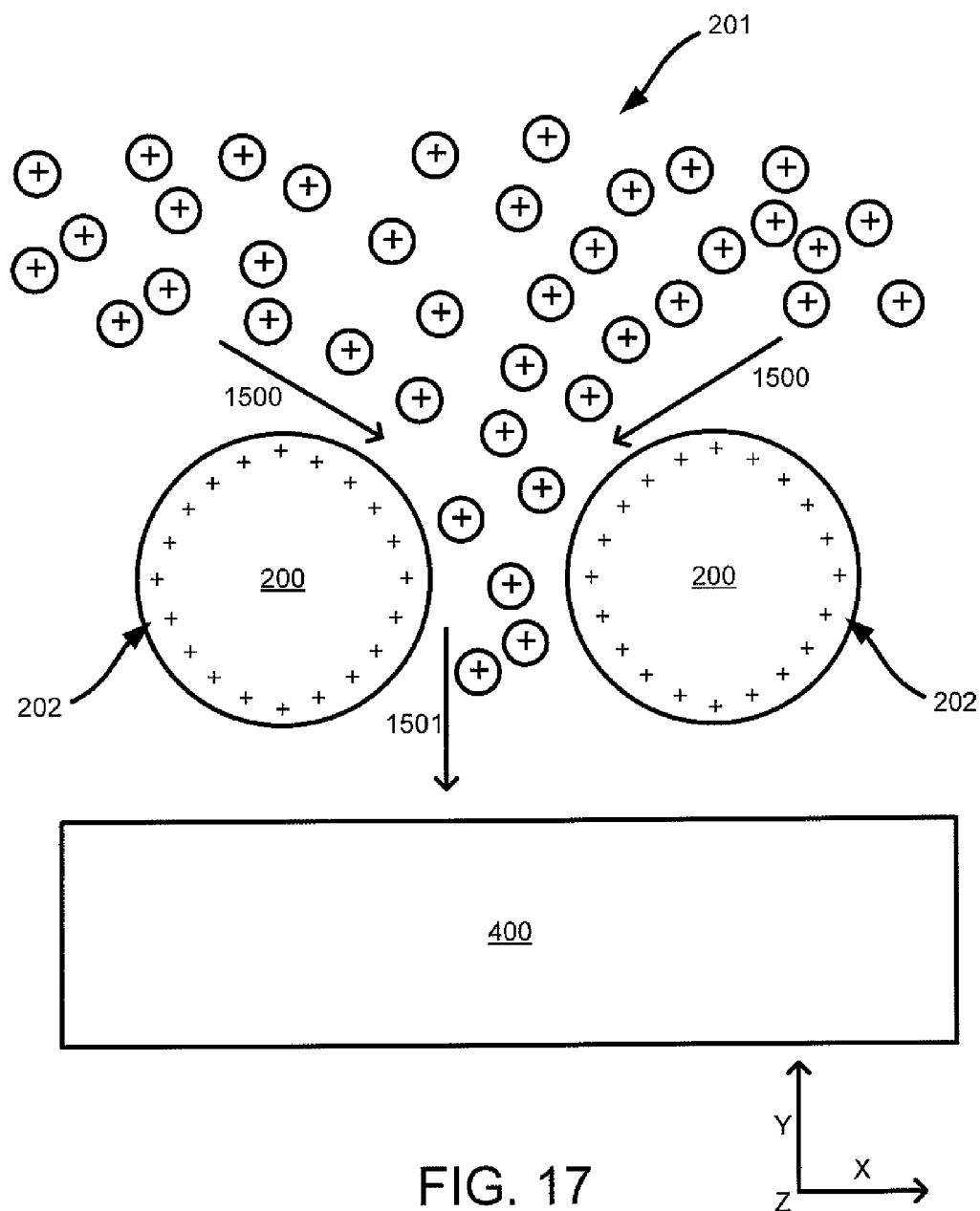
FIG. 17 is a cross-sectional view of focusing ions using lasers.

FIG. 17 is a cross-sectional view of focusing ions using lasers. Use of the lasers 200 may focus or funnel the ions 201 in one instance. Two lasers 200 are projected in the Z direction. Each laser 200 has a laser field 202 around the perimeter of the laser 200. The ions 201, which may be positively-charged, are being directed or attracted in the direction 1501. The presence of the laser fields 202 will focus or funnel the ions 201 of a similar charge in the direction 1500 between the two lasers 200. This may be used to implant or impact a narrow portion of a workpiece 400.

Figure 18:
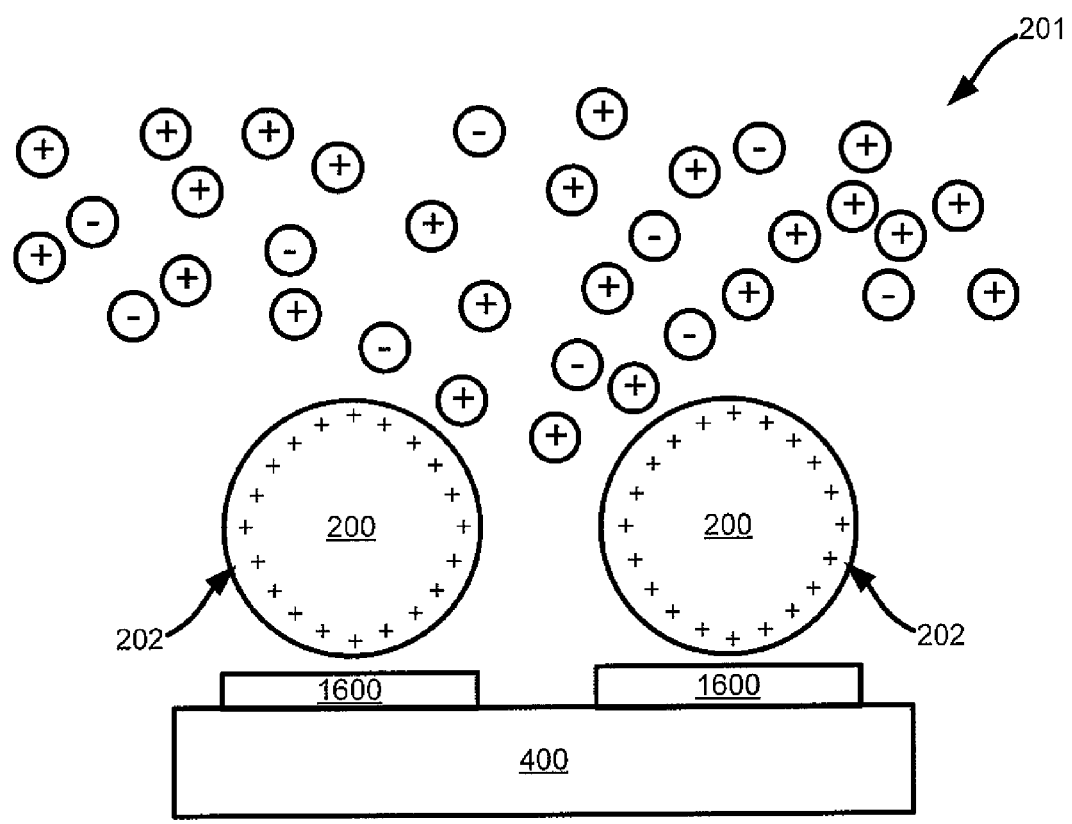
FIG. 18 is a cross-sectional view of laser-assisted deposition.

FIG. 18 is a cross-sectional view of laser-assisted deposition. In the embodiment of FIG. 18, the ions 201 are both positive and negative. Two lasers 200 are projected in the Z direction. Each laser 200 has a laser field 202 around the perimeter of the laser 200. The presence of the laser field 202 will repel ions 201 with a positive charge. However, ions 201 with a negative charge are attracted to the laser field 202. These ions 201 with a negative charge pass through the laser 200 and preferentially form deposits 1600 on the surface of the workpiece 400. The presence of the lasers 200 may allow patterned deposition of the ions 201 with a charge opposite that of the laser field 202. The embodiment of FIG. 18 may be combined with other implantation embodiments. Thus, ions 201 may be implanted between the lasers 200 and some ions deposited under the lasers 200. This may involve changing the bias to the workpiece 400. When the workpiece 400 is biased, the ions 201 are implanted while a portion of the ions 201 may be deposited when the workpiece 400 is not biased.

The embodiments described herein avoid costly and time-consuming photoresist lithography or patterned deposition steps. Furthermore, the embodiments described herein eliminate an alignment step for a stencil or shadow mask. Use of lasers improves implantation of workpieces for multiple reasons. First, it is easy to check alignment of lasers. The lasers will be generated in a straight line and the position of the lasers can be fixed. Second, the lasers will be placed in a desired location if the workpiece is in particular known position. Third, the width or size of the lasers can be adjusted. Fourth, the lasers can be generated significantly faster than the time it takes to position existing mask technology. This increases throughput. Fifth, contamination of a workpiece through use of a single stencil or shadow mask with multiple species is eliminated because there will be no buildup or contamination of the laser.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus comprising:
an apparatus that generates ions and directs said ions to a workpiece; and
a laser source that generates a laser, said laser projected above said workpiece in a line, said line disposed above a portion of said workpiece and blocking a fraction of said ions.

2. The apparatus of claim 1, wherein said laser source generates a plurality of lasers, each of said plurality of lasers projected above said workpiece in a line.

3. The apparatus of claim 1, further comprising at least one reflector, said reflector reflecting said laser whereby said laser forms a plurality of lines above said workpiece.

4. The apparatus of claim 1, wherein said ions are disposed in an ion beam.

5. The apparatus of claim 1, wherein said ions are disposed in an ion sheath.

6. A method of workpiece processing comprising:
generating a laser above a workpiece;
directing ions toward said workpiece;
blocking a fraction of said ions with said laser; and
impacting said workpiece with said ions in a first region.

7. The method of claim 6, further comprising pulsing said laser.

8. The method of claim 6, wherein said generating said laser and said directing said ions are at least partially simultaneous.

9. The method of claim 8, wherein said directing said ions occurs at least partly while said laser is not being generated.

10. The method of claim 9, wherein said generating of said laser is stopped thereby forming a wake, and wherein said ions fill said wake.

11. The method of claim 9, wherein said directing said ions comprises applying a bias to said workpiece.

12. The method of claim 6, further comprising generating a second laser above said workpiece and focusing said ions toward said workpiece.

13. The method of claim 6, further comprising biasing said workpiece.

14. The method of claim 13, wherein said biasing occurs during a first period when said directing said ions occurs and further comprising depositing said ions during a second period when said workpiece is not biased, said depositing occurring primarily in a region shadowed by said laser.

15. The method of claim 6, further comprising:
generating a second laser configured to shadow said first region;
directing a second species of ions toward said workpiece, said second species of ions different from said ions;
blocking a fraction of said second species of ions with said second laser; and
impacting said workpiece with said second species of ions in a second region adjacent said first region.

16. A method of workpiece processing comprising:
generating a laser above a workpiece;
directing ions toward said workpiece; and
blocking a fraction of said ions directed through said laser whereby said workpiece is implanted to a first dose in a first region of said workpiece shadowed by said laser and a second dose in a second region of said workpiece.

17. The method of claim 16, further comprising stopping said laser from being generated above said workpiece and implanting all of said workpiece with said ions.

18. The method of claim 16, wherein said workpiece is a solar cell.

* * * * *